Sept. 27, 1966
T. J. LAVIN
3,275,944
HIGH VOLTAGE D.C. COUPLED DIFFERENTIAL AMPLIFIER INCLUDING SERIES ENERGIZED TRANSISTORS
Filed Nov. 26, 1963
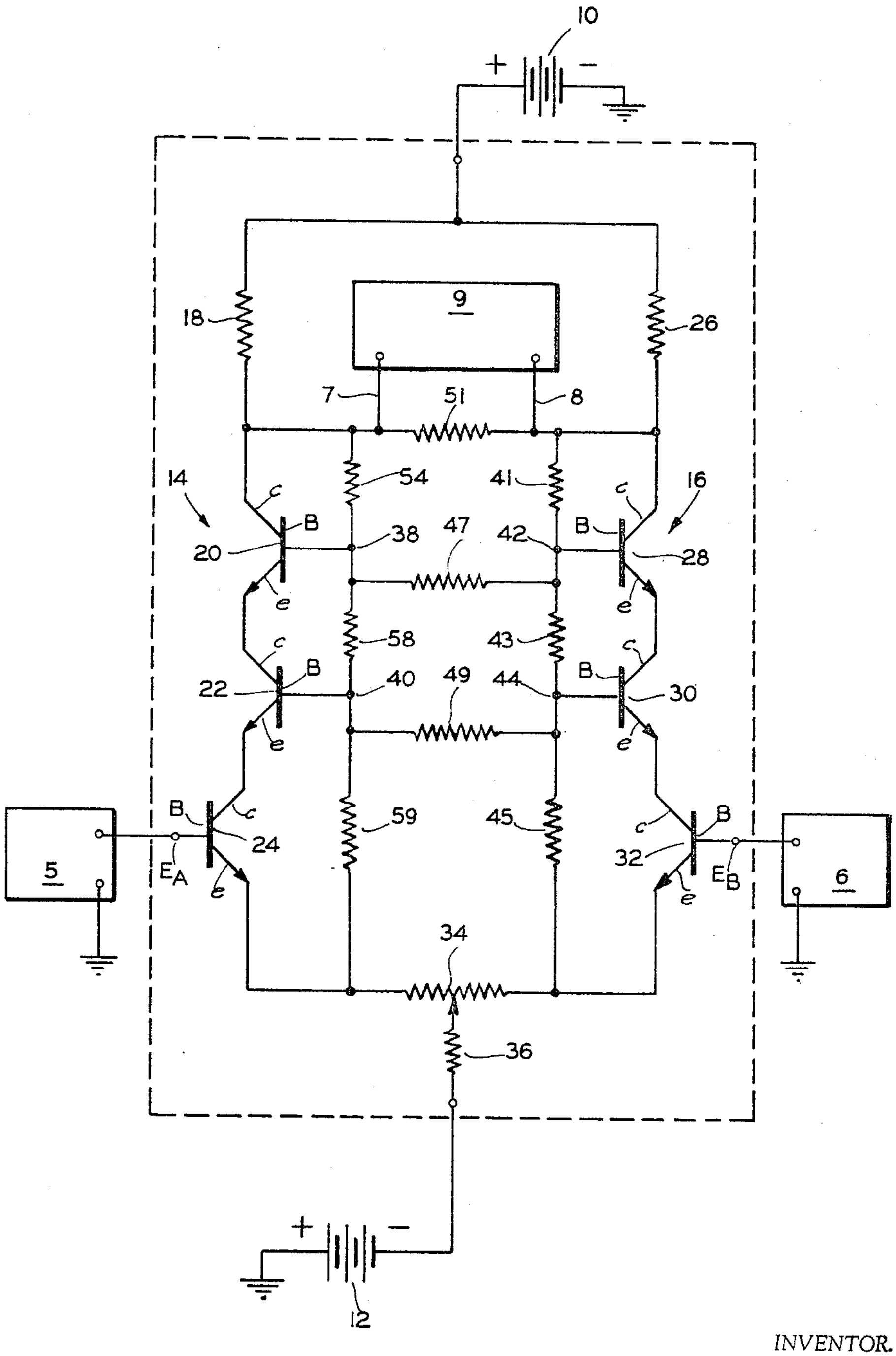
INVENTOR.
THOMAS J. LAVIN
BY Herbert L. Davis
ATTORNEY United States Patent Office 3,275,944
Patented Sept. 27, 1966

3,275,944

HIGH VOLTAGE D.C. COUPLED DIFFERENTIAL AMPLIFIER INCLUDING SERIES ENERGIZED TRANSISTORS

Thomas J. Lavin, Midland Park, N.J., assignor to The Bendix Corporation, Teterboro, N.J., a corporation of Delaware Filed Nov. 26, 1963, Ser. No. 326,081
5 Claims. (Cl. 330—18)

This invention relates to transistor amplifier circuitry and more particularly to a high frequency transistor amplifier with a high output voltage capability.

High voltage transistors presently available are limited to low frequency applications. It is found that this frequency limitation of high voltage transistors can be circumvented by utilizing a series string of low voltage transistors which have the desired high frequency capability. However, present series transistor arrangements are very critical to adjust and usually require a "try it and see" selection process to determine optimum biasing values, and even then as the transistors age and their parameters change, the custom fitted biasing resistors have to be readjusted again in order to maintain equal power distribution.

Briefly this invention contemplates a differential amplifier utilizing a plurality of transistors in series arrangement on each side to achieve the desired high voltage configuration, and voltage dividers effectively in parallel with said transistor series in combination with stabilization resistors coupling the voltage dividers to provide the necessary bias for the circuit and at the same time insure an equal distribution of voltage among the individual transistors.

An object of this invention is to provide an improved high frequency series energized transistor amplifier with a high voltage output.

Another object of this invention is to provide a high voltage D.C. coupled differential amplifier circuit which is insensitive to parameter variations caused by aging of the transistors.

A further object of this invention is to provide a high voltage amplifier biasing arrangement where transistors of a given type can be substituted freely without readjustment of the biasing arrangement.

The foregoing and other objects and advantages of the invention will appear more fully hereinafter from a consideration of the detailed description which follows, taken together with the accompanying drawing wherein one embodiment of the invention is illustrated by way of example.

It is to be expressly understood, however, that the drawing is for illustration purposes only and is not to be construed as defining the limits of the invention.

The drawing is a schematic diagram of a high voltage D.C. coupled differential amplifier constructed according to the invention.

Referring to the drawing, the circuit shown includes suitable electrical signal sources 5 and 6 and which signals may be A.C. or D.C.; electrical output lines 7 and 8 leading from the differential amplifier circuit to a suitable electrical circuit 9 to be operated thereby; a source of positive potential such as battery 10; and a source of negative potential such as battery 12. Between the batteries are connected two parallel current paths 14 and 16. Path 14 includes a resistor 18 and three n-p-n junction transistors 20, 22, and 24 connected in series and each transistor having collector, base, and emitter electrodes. Similarly, path 16 includes resistor 26 and three n-p-n junction transistors 28, 30, and 32 with each transistor having collector, base, and emitter electrodes. Transistors 24 and 32 are arranged in differential amplifier configuration with the input terminals $E_A$ and $E_B$ respectively connecting the bases of the two transistors 24 and 32 to the electrical signal sources 5 and 6. The emitters of transistors 32 and 24 are connected to opposite terminals of a potentiometer 34 having its movable contact connected through a resistor 36 and battery 12 to ground.

A voltage divider means is connected in parallel with each set of series-connected transistors and tappings from the voltage divider means are connected to the bases of all but the first transistors 24 and 32, so that irrespective of the electrical input signal, the collector-emitter potential difference of each transistor in the series is so controlled that it cannot exceed a predetermined part of the supply voltage.

The voltage divider means in parallel with the series connected collector-emitter transistors 20, 22, and 24 comprise resistors 54, 58, and 59, transistor 20 having a connection from its base to an individual tapping 38 on said voltage divider means and transistor 22 having a connection from its base to an individual tapping 40 on said voltage divider means.

Similarly, the voltage divider means in parallel with the series connected collector-emitter paths of transistors 28, 30, and 32 comprise resistors 41, 43, and 45, transistor 28 having a connection from its base to an individual tapping 42 on said voltage divider means and transistor 30 having a connection from its base to an individual tapping 44 on said voltage divider means.

Stabilization resistors 47 and 49 which enable satisfactory linear operation over very large output voltage swings are connected between terminals 38 and 42 and terminals 40 and 44 respectively of said voltage divider means. A load resistor 51 is connected between the collector of the transistor 20 and the collector of the transistor 28 while the differential amplifier output lines 7 and 8 lead from opposite ends of the load resistor 51 to the electrical circuit 9 to be operated thereby.

Considering the operation of the circuit in the drawing, the potentiometer 34 is provided for initial balancing of the differential amplifier. The voltage dividers comprising resistors 54, 58, and 59 and 41, 43, and 45 establish the base potential for transistors 20, 22, and 28, 30 respectively.

With zero differential electrical input signals $(E_A - E_B)$ =zero, the amplifier is in a balanced condition, the no signal base bias currents required for transistors 22, 20 and 30, 28 are supplied by the voltage divider on each side of the differential arrangement and no current flows through resistors 51, 47, or 49.

When large differential electrical input signals ($E_A$ and $E_B$) are applied across transistors 24 and 32, such that the voltage at the collector of transistor 20 is near a maximum positive value and the voltage at the collector of transistor 28 is near some minimum positive value, the voltage across the voltage divider series string of resistors 41, 43, and 45 is considerably less than its no signal value and transistors 28 and 30 conduct about twice their balanced condition current.

Since there is a very large voltage across the voltage divider 54, 58, 59 and transistors 20 and 22 need less base current than they did under balanced condition, the base current not required by 20 is supplied to 28 through resistor 47 and the base current not required by 22 is applied to 30 through resistor 49. Thus it is seen that by the use of resistors 47 and 49 and the amount of the base current required by the associated pairs of transistors 20, 28 and 22, 30 being constant an equal voltage division across the series connected transistors is maintained under all normal operating signal conditions.

From the previous discussion, it is evident that through the use of the novel resistor configuration of resistors 51, 47, 49, 54, 58, 59, 41, 43, and 45, the necessary bias for the circuit is provided insuring an equal distribution of voltage among the individual transistors thus achieving relative immunity to transistor parameter variations.

This relative immunity to transistor parameter variations achieves even another beneficial result in that it permits the substitution in the circuit of transistors of a given type without the necessity of readjusting the resistor values which provide the necessary bias.

Although only one embodiment of the invention has been illustrated and described, various changes in the form and relative arrangements of the parts, which will now appear to those skilled in the art may be made without departing from the scope of the invention. Reference is, therefore, to be had to the appended claims for a definition of the limits of the invention.

What is claimed is:

1. A circuit arrangement comprising a plurality of transistors each having emitter, base and collector electrodes,
   a first and second transistor of said plurality arranged in differential amplifier connection,
   the remaining transistors of said plurality being evenly divided into first and second groups in combination with said first and second transistors,
   input terminals for supplying differential electrical input signals to the bases of said first and second transistors,
   a supply source of electrical energy,
   a first resistor in series with said supply source,
   one terminal of the series combination of said first resistor and said supply source being connected to the collector of the last transistor of the remaining of said plurality of transistors in said first group,
   a second resistor in series with said supply source,
   one terminal of the series combination of said second resistor and supply source being connected to the collector of the last transistor of the remaining of said plurality of transistors in said second group,
   circuit means providing a direct current series connection from the collector of said first transistor across the emitter-collector paths of the remaining of said plurality of transistors in said first group to said one terminal of the series combination of said first resistor and supply source,
   circuit means providing a direct current series connection from the collector of said second transistor across the emitter collector paths of the remaining of said plurality of transistors in said second group to said one terminal of the series combination of said second resistor and supply source,
   the other terminal of said supply source being connected to the emitter of said first and second transistors,
   a first voltage divider connected from the emitter of said first transistor to the collector of the last transistor of the remaining of said plurality of transistors in said first group,
   circuit means connecting each of the base electrodes of the remaining of said transistors of said plurality of transistors in said first group to separate points on said first voltage divider,
   a second voltage divider connected from the emitter of said second transistor to the collector of the last transistor of the remaining of said plurality of transistors in said second group,
   circuit means connecting each of the base electrodes of the remaining of said transistors of said plurality of transistors in said second group to separate points on said second voltage divider,
   a load resistor connected from the collector of the last transistor of the remaining of said plurality of transistors in said first group to the collector of the last transistor of the remaining of said plurality of transistors in said second group,
   electrical output lines leading from opposite ends of the load resistor,
   resistance means connecting the separate points on said first voltage divider to the associated separate points on the second voltage divider whereby the base current of the associated pairs of transistors remains constant, thus maintaining an equal voltage division across the series connected transistors.

2. A stabilized transistor amplifier comprising in combination
   a source of direct current energizing potential having a positive and negative terminals,
   a resistor,
   a plurality of transistors having collector, base and emitter electrodes,
   coupling impedance means,
   first circuit means connecting said resistor, said plurality of transistors and coupling impedance means in series in the order named between said positive and negative terminals of said source of direct current whereby the collector of the first transistor in said plurality of transistors is connected to said resistor and the emitter-collector paths of said transistors being connected in series relation,
   an additional resistor,
   another plurality of transistors having collector, base and emitter electrodes,
   a second circuit means connecting said additional resistor, said other plurality of transistors and said coupling impedance means in the order named between said positive and negative terminals of said source of direct current whereby the collector of the first transistor in said other plurality of transistors is connected to said additional resistor and the emitter collector paths of said transistors being connected in series energized relation,
   the last transistors of said pluralities of transistors of said first and second circuit means being connected in differential configuration,
   input terminals for supplying differential electrical input signals to the bases of said last transistors,
   voltage divider means connected in parallel with the series connected transistors of said first circuit means,
   base electrodes of the transistors in said first circuit means being connected to separate points on said voltage divider means,
   an additional voltage divider means connected in parallel with the series connected transistors of said second circuit means providing equal voltage division across the transistors of the respective series,
   base electrodes of the transistors in said second circuit means being connected to separate points on said additional voltage divider means,
   further resistance means connected between the voltage dividers for supplying additional bias control and stabilization for unbalanced conditions to the bases of the transistors other than the last transistors of said pluralities of transistors of the first and second circuit means,
   and electrical output means leading from the collectors of said first transistors in said first and second circuit means.

3. A stabilized transistor amplifier comprising in combination a source of direct current energizing potential having positive and negative terminals, a resistor, a plurality of transistors having collector, base and emitter electrodes, coupling impedance means, first circuit means connecting said resistor, said plurality of transistors and coupling impedance means in series in the order named between said positive and negative terminals of said source of direct current whereby the collector of the first transistor in said plurality of transistors is connected to said resistor and the emitter-collector paths of said transistors being connected in series energized relation, an additional resistor, another plurality of transistors having collector, base and emitter electrodes, a second circuit means connecting said additional resistor, said other plurality of transistors and said coupling impedance means in the order named between said positive and negative terminals of said source of direct current whereby the collector of the first transistor in said other plurality of transistors is connected to said additional resistor and the emitter-collector paths of said transistors being connected in series energized relation, the last transistors of said pluralities of transistors of said first and second circuit means being connected in differential configuration, input terminals for supplying differential electrical input signals to the bases of said last transistors, output terminals connected to the collectors of said first transistors in said first and second circuit means, a load resistor connected across said output terminals, voltage divider means connected in parallel with the series connected transistors of said first circuit means, base electrodes of the transistors in said first circuit means being connected to separate points on said voltage divider means, an additional voltage divider means connected in parallel with the series connected transistors of said second circuit means providing equal voltage division across the transistors of the respective series, base electrodes of the transistors in said second circuit means being connected to separate points on said additional voltage divider means, and further resistance means connected between the voltage dividers for supplying additional bias control and stabilization for unbalanced conditions.

4. A stabilized transistor amplifier comprising in combination, a source of direct current energizing potential having positive and negative terminals, a resistor, a plurality of transistors having collector, base and emitter electrodes, coupling impedance means, first circuit means connecting said resistor, said plurality of transistors and coupling impedance means in series in the order named between said positive and negative terminals of said source of direct current whereby the collector of the first transistor in said plurality of transistors is connected to said resistor and the emitter-collector paths of said transistors being connected in series energized relation, an additional resistor, another plurality of transistors having collector, base and emitter electrodes, a second circuit means connecting said additional resistor, said other plurality of transistors and said coupling impedance means in the order named between said positive and negative terminals of said source of direct current whereby the collector of the first transistor in said other plurality of transistors is connected to said additional resistor and the emitter-collector paths of said transistors being connected in series energized relation, the last transistor of each of said pluralities of transistors of said first and second circuit means being connected in differential configuration, input terminals for supplying differential electrical input signals to the bases of said last transistors, output terminals connected to the collectors of said first transistors in said first and second circuit means, a load resistor connected across said output terminals, first voltage divider means connecting the collector of said first transistor in said first circuit means to the emitter of the last transistor in said first circuit means, circuit means connecting each of the base electrodes of the transistors in said first circuit means other than the last transistor thereof to separate points on said first voltage divider, second voltage divider means connecting the collector of said first transistor in said second circuit means to the emitter of the last transistor in said second circuit means, circuit means connecting each of the base electrodes of the transistors in said second circuit means other than the last transistor thereof to separate points on said second voltage divider, and resistor means connecting said separate points on said first voltage divider to said separate points on said second voltage divider corresponding thereto so as to enable the voltage divider of one of said circuit means to supply bias current to the voltage divider of the other circuit means so as to provide the necessary bias for the other circuit means to assure an equal voltage distribution among the transistors.

5. A differential amplifier of a type including a first circuit means, a plurality of transistors having collector, base and emitter electrodes and the emitter-collector paths of said transistors being connected in series energized relation in said first circuit means, a second circuit means, another plurality of transistors each having collector, base and emitter electrodes and the emitter-collector paths of said transistors being connected in series energized relation in said second circuit means, voltage divider means connected in parallel with each of the series connected transistors of the first circuit means, additional voltage divider means connected in parallel with each of the series connected transistors of the second circuit means, means for supplying differential input signals to the bases of the last transistors of said pluralities of transistors of said first and second circuit means, means connecting separate points on said first voltage divider means to the bases of the transistors of said first circuit means other than the last of said transistors, means connecting corresponding separate points on the second voltage divider means to the bases of the transistors of said second circuit means other than the last of said transistors, means to differentially couple said first and second circuit means, and electrical output conductors leading from said first and second circuit means;

the improvement comprising stabilizing resistor means connecting the corresponding separate points on said first and second voltage divider means so as to apply from the voltage dividing means of one of said circuit means biasing voltages to the bases the transistors other than the last transistor of said other circuit means to stabilize operation thereof under unbalanced electrical conditions of operation of said first and second circuit means.

References Cited by the Examiner

UNITED STATES PATENTS

| | | | |
|---|---|---|---|
| 2,424,893 | 7/1947 | Mansford | 330—71 |
| 2,780,682 | 2/1957 | Klein | 330—69 |
| 2,941,155 | 6/1960 | Lucas | 330—69 |
| 2,981,895 | 4/1961 | Koch | 330—18 |
| 3,018,446 | 1/1962 | Knudson | 330—18 X |
| 3,024,422 | 3/1962 | Jansson | 330—18 |

ROY LAKE, *Primary Examiner.*

F. D. PARIS, *Assistant Examiner.*